(12) United States Patent
Kim

(10) Patent No.: US 7,105,919 B2
(45) Date of Patent: Sep. 12, 2006

(54) SEMICONDUCTOR PACKAGE HAVING ULTRA-THIN THICKNESS AND METHOD OF MANUFACTURING THE SAME

(75) Inventor: Hyeong-Seob Kim, Chungcheongnam-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/982,361

(22) Filed: Nov. 3, 2004

(65) Prior Publication Data

US 2005/0098879 A1    May 12, 2005

(30) Foreign Application Priority Data

Nov. 11, 2003    (KR)    ...................... 10-2003-0079597

(51) Int. Cl.
*H01L 23/48*    (2006.01)
*H01L 23/12*    (2006.01)
*H01L 23/053*    (2006.01)

(52) U.S. Cl. ...................... 257/700; 257/693; 257/701; 257/783; 257/787; 257/793

(58) Field of Classification Search ................ 257/693, 257/700–701, 783, 787, 791, 793, 706–708, 257/711–713

See application file for complete search history.

(56) References Cited

U.S. PATENT DOCUMENTS

| | | | |
|---|---|---|---|
| 5,446,620 A | * | 8/1995 | Burns et al. .................. 361/704 |
| 5,972,736 A | * | 10/1999 | Malladi et al. .............. 438/118 |
| 6,395,579 B1 | | 5/2002 | Tandy et al. |

FOREIGN PATENT DOCUMENTS

JP    64-47058    * 2/1989    ................. 257/706

* cited by examiner

*Primary Examiner*—Jasmine Clark
(74) *Attorney, Agent, or Firm*—Marger Johnson & McCollom, P.C.

(57) ABSTRACT

A semiconductor package having an ultra thin thickness and a method of manufacturing the same are provided. The ultra thin semiconductor package comprises a circuit board in which a through hole is formed. A semiconductor chip is located in the through hole and a connecting element electrically connects the circuit board and the semiconductor chip. An epoxy molding compound (EMC) covers the semiconductor chip and the connecting element and a supporter having a thermal expansion coefficient similar to the EMC is attached inside the through hole on a lower surface of the semiconductor chip. An external connecting terminal is attached to at least one side of the circuit board. Because of the inclusion of the supporter, warpage of the semiconductor package resulting from the curing of the EMC is prevented.

27 Claims, 7 Drawing Sheets

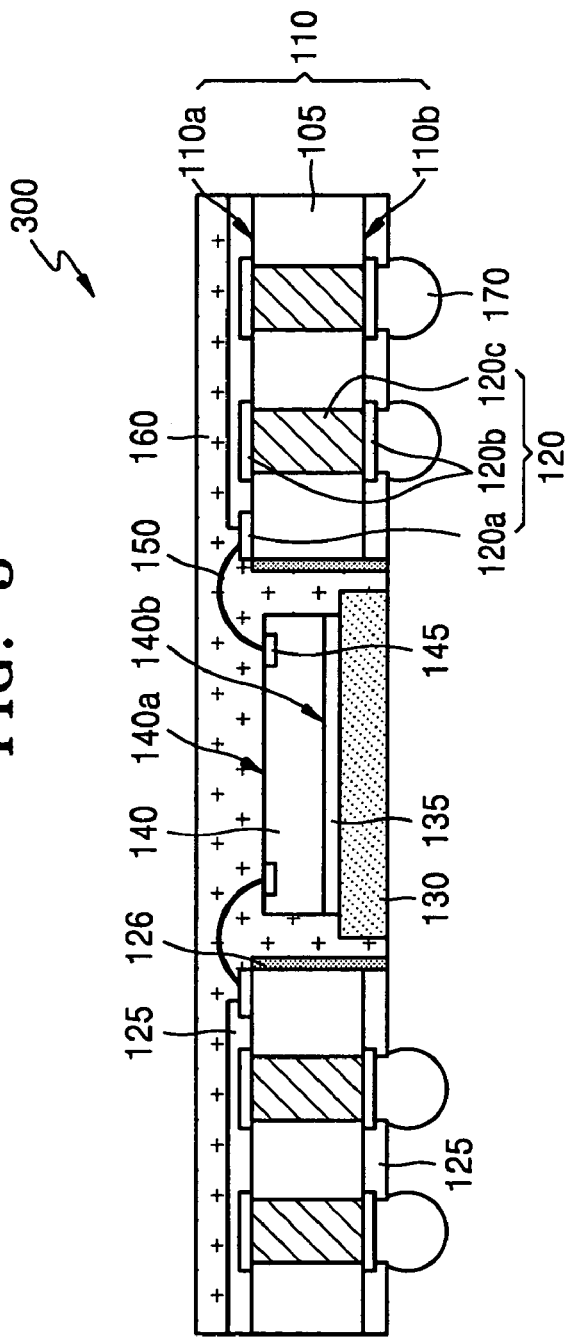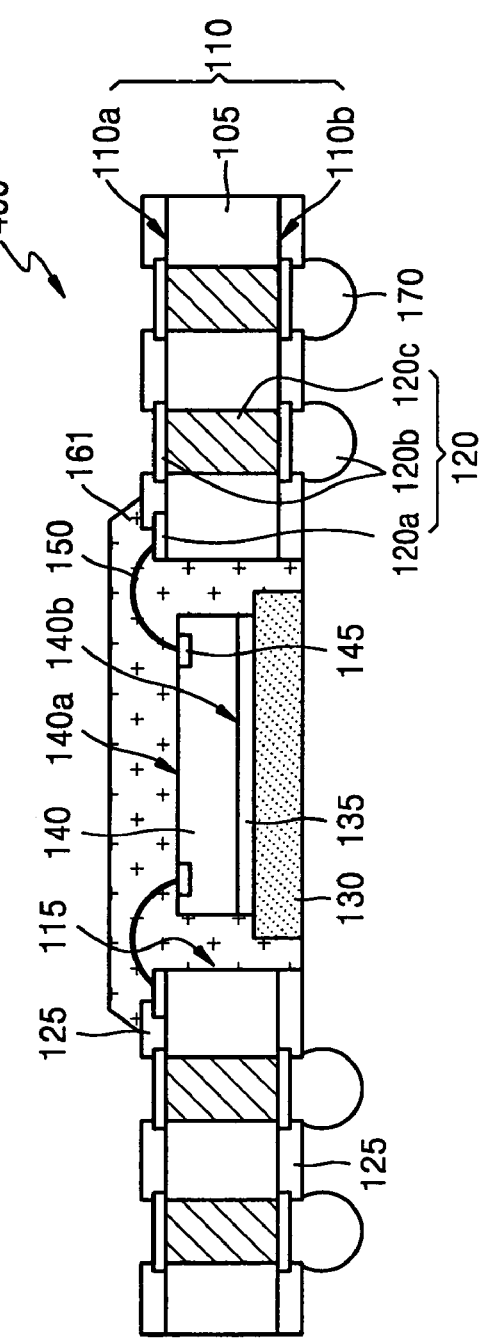

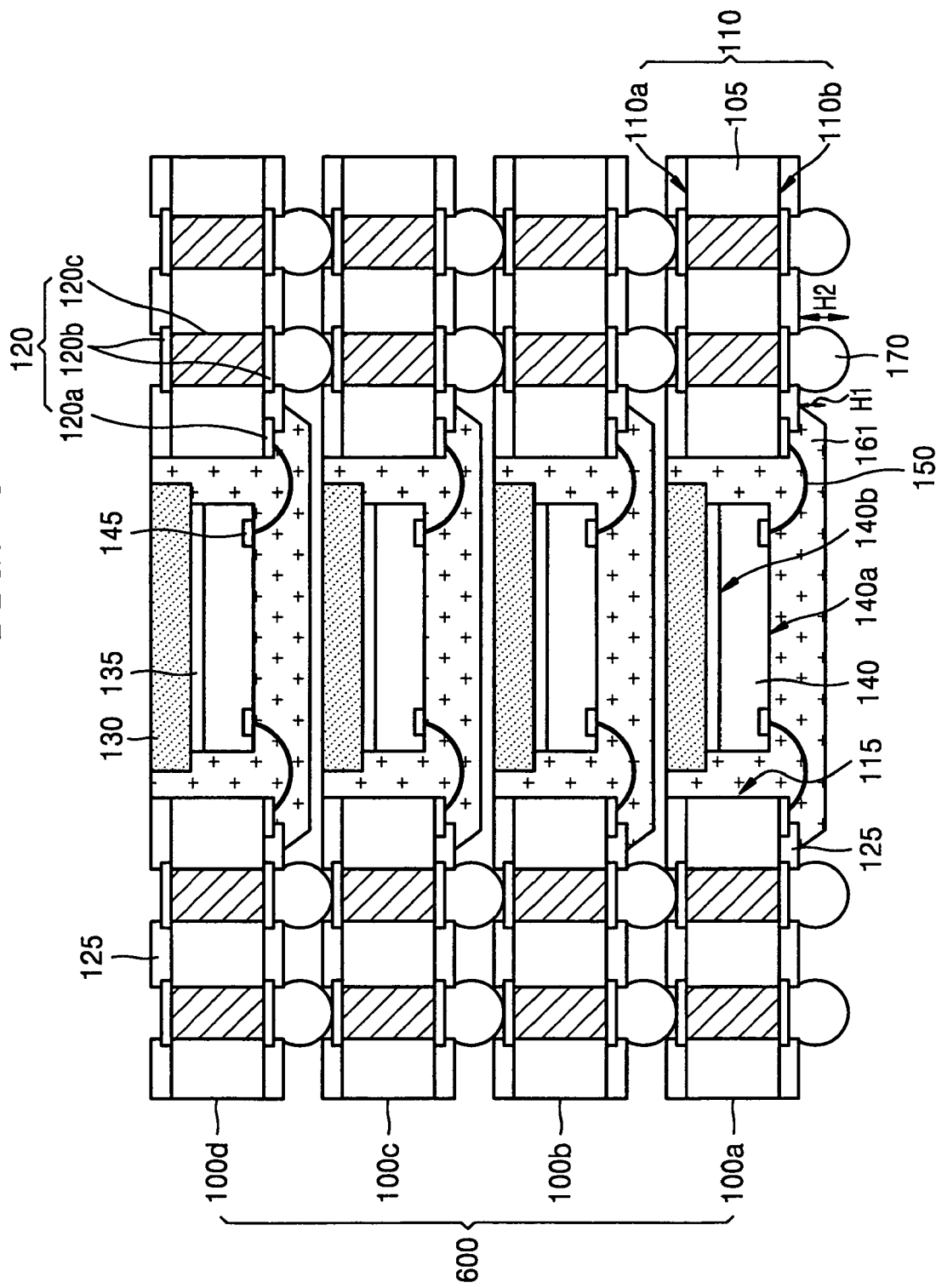

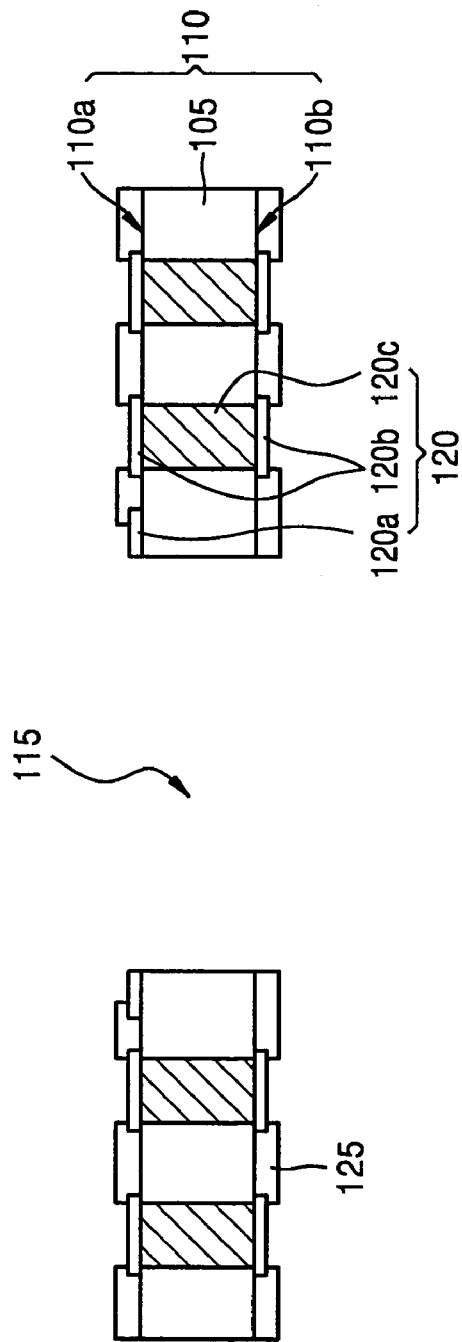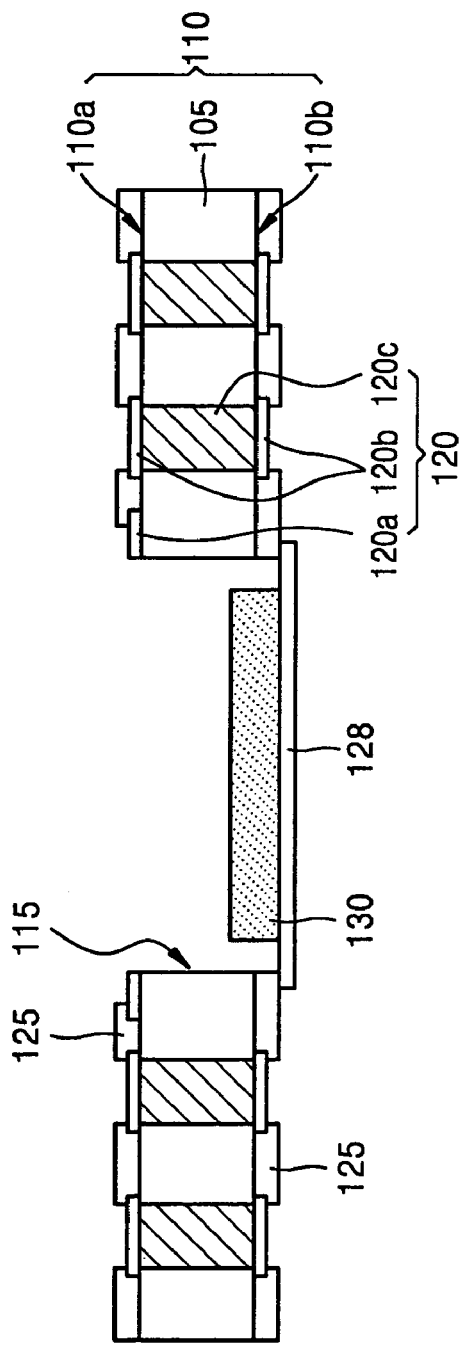

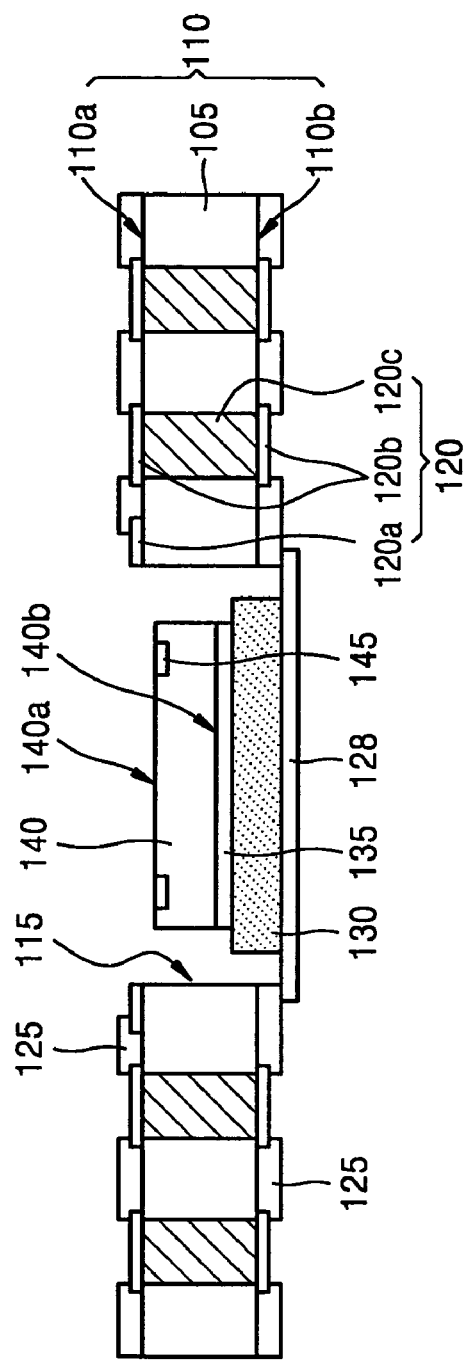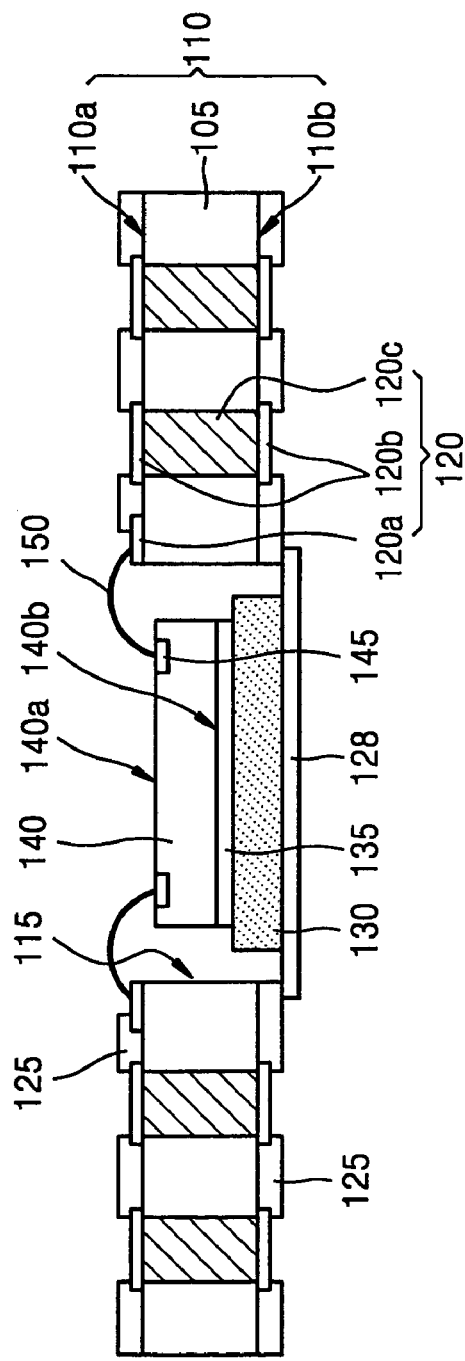

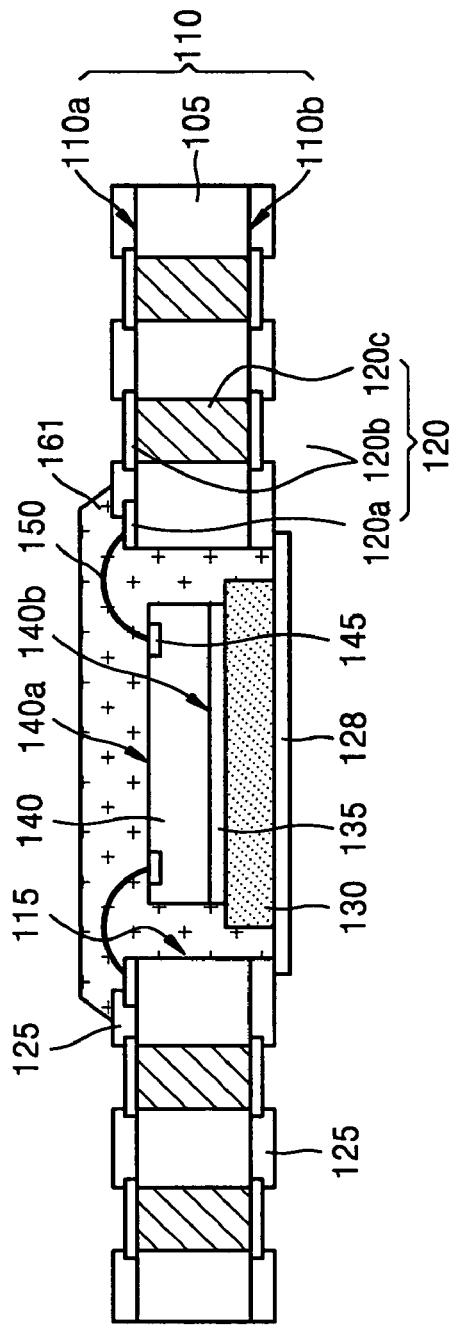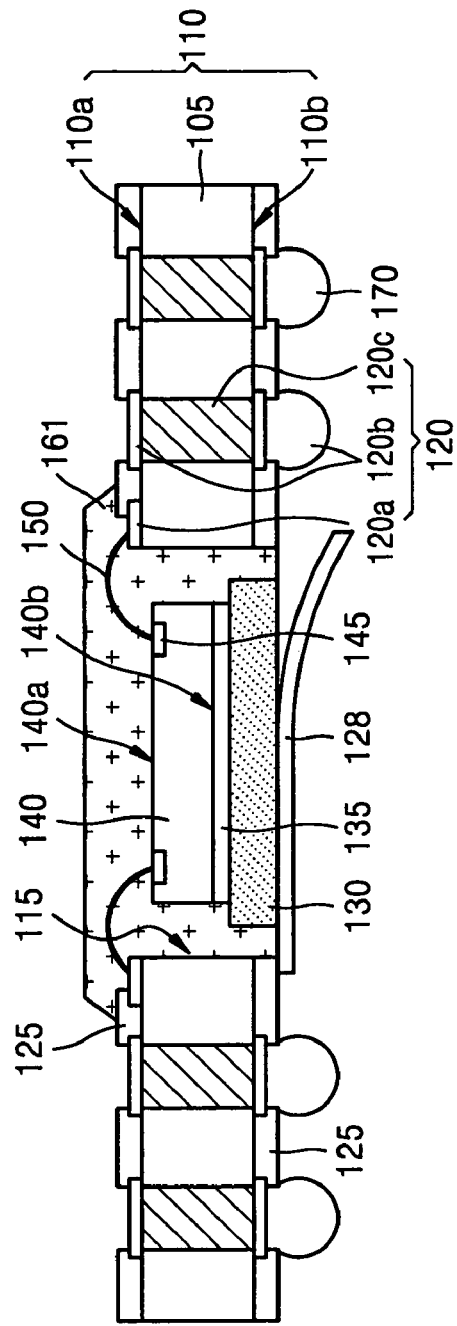

SEMICONDUCTOR PACKAGE HAVING ULTRA-THIN THICKNESS AND METHOD OF MANUFACTURING THE SAME

This application claims the priority of Korean Patent Application No. 2003-79597, filed on Nov. 11, 2003, in the Korean Intellectual Property Office, the disclosure of which is incorporated herein in its entirety by reference.

BACKGROUND OF THE INVENTION

1. Field of the Invention

The present invention relates to a semiconductor package and a method of manufacturing the same, and more particularly, to an ultra-thin semiconductor package having a supporter that prevents warpage of the semiconductor package and a method of manufacturing the same.

2. Description of the Related Art

Smaller and thinner semiconductor packages such as a chip scale package, a micro ball grid array package, and an ultra-thin semiconductor package have recently been developed.

An ultra-thin semiconductor package is disclosed in U.S. Pat. No. 6,395,579. The structure of an ultra-thin semiconductor package will now be described.

FIG. 1 is a cross-sectional view of a conventional semiconductor package 100 having a through hole.

Referring to FIG. 1, a circuit board 10 has a through hole 12 with a size similar to a chip and a semiconductor chip 30 is located in the through hole 12. The semiconductor chip 30, which is located in the through hole 12, is electrically connected to a circuit pattern 18 of the circuit board 10. Predetermined portions of the semiconductor chip 30 and the circuit board 10 are molded by an epoxy molding compound (EMC) 50 composed of a resin material. In addition, a conductive ball 60 is attached to a lower surface of the circuit board 10.

The semiconductor package 100 can have a thickness similar to the height of the semiconductor chip 30.

A resin material is generally used for the EMC 50, covering predetermined portions of the semiconductor chip 30 and predetermined portions of the circuit board 10.

The EMC 50 is formed by spreading the resin material on the semiconductor chip 30 and the circuit board 10 and then curing the resin material at a predetermined temperature. The EMC 50 contracts in the curing process.

However, as is well known to those skilled in the art, the EMC 50 formed of the resin material and the semiconductor chip 30 formed of a silicon material have different thermal expansion coefficients, and thus, they contract by different amounts in the curing process. Therefore, as illustrated by W in FIG. 1, the semiconductor chip 30 and the EMC 50 may warp due to the relatively low contraction rate of the semiconductor chip 30. This is called warpage.

A degree of warpage d of the semiconductor chip 30 and the EMC 50 may be 100 to 400 µm. The warpage causes the height of the semiconductor package to increase. Thus, an ultra-thin semiconductor package would not be obtained. Furthermore, cracks may occur due to the warpage of the semiconductor package.

SUMMARY OF THE INVENTION

The present invention provides a semiconductor package having an ultra-thin thickness and a method of manufacturing the same in such a way that warpage of the semiconductor package is prevented.

According to an aspect of the present invention, there is provided an ultra thin semiconductor package comprising a circuit board having a through hole; a semiconductor chip located in the through hole of the circuit board; a connecting element electrically connecting the circuit board and the semiconductor chip; an epoxy molding compound (EMC) covering the semiconductor chip and the connecting element; an external connecting terminal which is electrically connected to at least one side of the circuit board; and a supporter attached to a lower surface of the semiconductor chip and having a thermal expansion coefficient substantially equal to or greater than a thermal expansion coefficient of the EMC.

According to still another aspect of the present invention, there is provided a method of manufacturing an ultra thin semiconductor package, the method comprising providing a circuit board in which a through hole is formed; attaching a closure member to a lower surface of the circuit board, thereby covering the through hole; forming a supporter on an upper surface of the closure member; attaching a semiconductor chip having an input/output pad in its upper edge to an upper surface of the supporter; electrically connecting the input/output pad of the semiconductor chip and the circuit board; forming an epoxy molding compound (EMC) that covers at least part of the semiconductor chip, and the circuit board; attaching a solder ball to the lower surface of the circuit board; and removing the closure member, where a thermal expansion coefficient of the supporter is substantially equal to or greater than a thermal expansion coefficient of the EMC.

BRIEF DESCRIPTION OF THE DRAWINGS

The above and other features and advantages of the present invention will become more apparent by describing in detail exemplary embodiments thereof with reference to the attached drawings in which:

FIG. 3 is a cross-sectional view of an ultra-thin semiconductor package according to a second embodiment of the present invention;

FIG. 4 is a cross-sectional view of an ultra-thin semiconductor package according to a third embodiment of the present invention;

FIG. 6 is a cross-sectional view of a stacked semiconductor package using ultra-thin semiconductor packages according to a fifth embodiment of the present invention; and FIGS. 7A through 7F are cross-sections illustrating a method of manufacturing an ultra-thin semiconductor package according to a sixth embodiment of the present invention.

DETAILED DESCRIPTION

Figure 1:
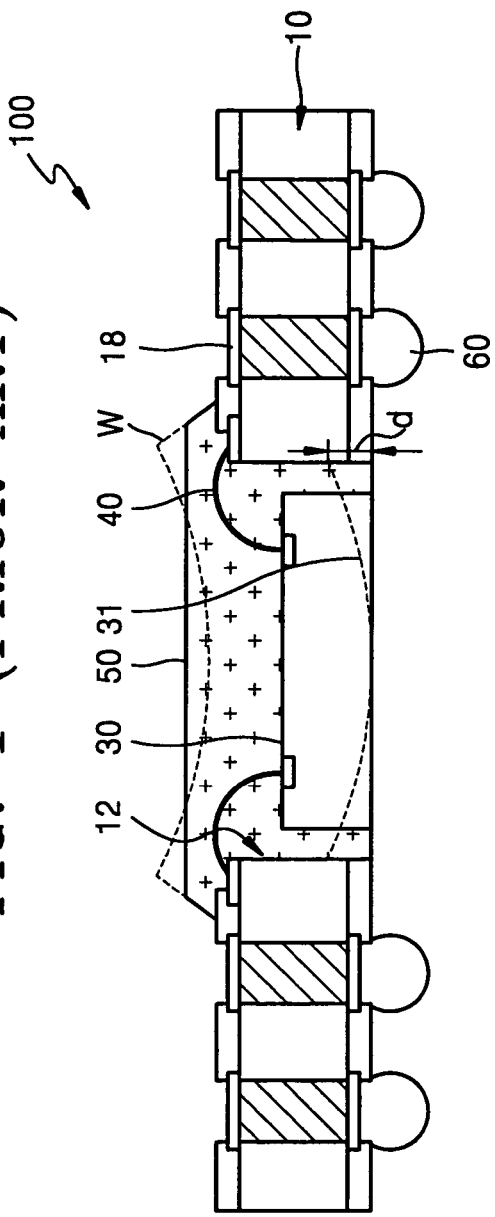
FIG. 1 is a cross-sectional view of a conventional semiconductor package having a through hole.

The present invention will now be described more fully with reference to the accompanying drawings in which exemplary embodiments of the invention are shown. This invention may, however, be embodied in many different forms and should not be construed as being limited to the embodiments set forth herein; rather these embodiments are provided so that this disclosure will be thorough and complete, and will fully convey the concept of the invention to those skilled in the art. In the drawings, the forms of the elements are exaggerated for clarity. To facilitate understanding, identical reference numerals have been used, where possible, to designate identical elements.

Figure 2:
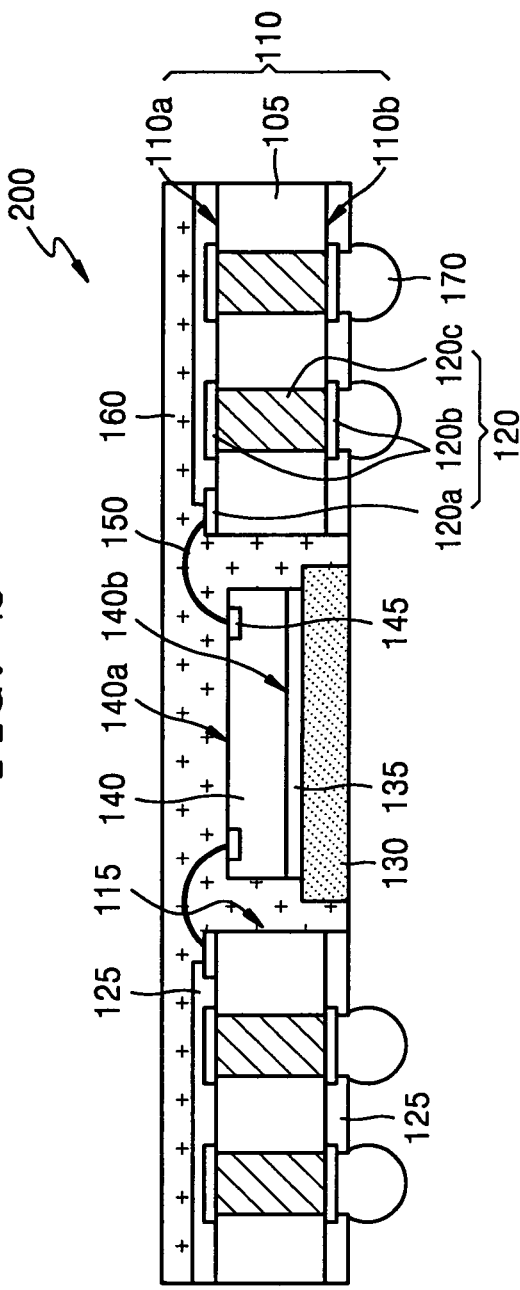
FIG. 2 is a cross-sectional view of an ultra-thin semiconductor package having a through hole according to a first embodiment of the present invention.

FIG. 2 is a cross-section of an ultra-thin semiconductor package having a through hole according to a first embodiment of the present invention.

Referring to FIG. 2, a semiconductor package 200 comprises a circuit board 110 having a first surface 110a and a second surface 110b. The circuit board 110 is formed of a resin board 105, for instance, BT (mismaleimide triazine). A through hole 115 is formed in a predetermined portion of the circuit board 110. A circuit pattern 120 is formed in upper and lower portions of the circuit board 110 as well as through the circuit board 110. The circuit pattern 120 includes a bond finger 120a, ball lands 120b, and a stud 120c. The bond finger 120a is disposed near the through hole 115 and is formed of an Au, Ag, or metal layer. In addition, the bond finger 120a may be formed selectively on the first surface 110a or the second surface 10b of the circuit board 110. The ball lands 120b include upper and lower ball lands, which are respectively formed on the first surface 110a and the second surface 110b of the circuit board 110. The upper and lower ball lands 120b, disposed opposite each other across the circuit board 110, are formed of Au, Ag, Ni, or Pd. The stud 120c electrically connects the corresponding upper and lower ball lands 120b.

A protection layer 125 covers the first and second surfaces 110a and 110b of the circuit board 110. The protection layer 125, formed of an insulating layer, protects the circuit pattern 120 from an external environment and prevents a short between the circuit patterns 120. However, the ball lands 120b that are exposed and contact the external connecting terminal should not be covered by the protection layer 125.

A supporter 130, which has a square or tiled shape, is located in the through hole 115 and a semiconductor chip 140 is attached to an upper portion of the supporter 130 by an adhesive bonding layer 135.

The semiconductor chip 140 has a first surface 140a in which an input/output pad 145 is formed and a second surface 140b to which the supporter 130 is attached. The input/output pad 145 is formed at an edge of the first surface 140a of the semiconductor chip 140. In addition, the input/output pad 145 may be electrically connected to the bond finger 120a by a connecting element 150 formed of one of Au and Al or a lead extended from the bond finger 120a.

The semiconductor chip 140, the connecting element 150, and the first surface 110a of the circuit board 110 are sealed by an epoxy molding compound (EMC) 160. The EMC 160 may be a resin material.

The supporter 130, to which the semiconductor chip 140 is attached, prevents warpage of the semiconductor chip 140 and the EMC 160 due to the difference between thermal expansion coefficients of the EMC 160 and the semiconductor chip 140. The supporter 130 may be formed of a resin or Cu foil having a thermal expansion coefficient equal to or 1 to 10 times larger than that of the EMC 160 and having a thickness of 10 to 50 μm. It is preferable that the supporter 130 and the EMC 160 have the same thermal expansion coefficient. However, a material having a thermal expansion coefficient larger than that of the EMC 160 is more preferably used for the supporter 130 since the size and thickness of the supporter 130 are relatively smaller than the size and thickness of the EMC 160.

The supporter 130 should be formed in the through hole 115 in order to prevent the height of the semiconductor package 100 from increasing. For instance, if the supporter 130 occupies a predetermined region in a lower portion of the circuit board 110, the height of the semiconductor package 100 decreases by the thickness of the supporter 130. Therefore, the semiconductor package 100 is preferably located in the through hole 115.

Furthermore, the adhesive bonding layer 135 attaching the supporter 130 to the semiconductor chip 140 may be an adhesive sheet or paste and have a thickness to fully attach the supporter 130 and the semiconductor chip 140. The thickness of the adhesive bonding layer may be, for instance, a thickness of about 10 to 50 μm.

Solder balls 170, which are external connecting terminals, are attached to the lower ball lands 120b which are formed in the second surface 10b of the circuit board 110.

Referring to FIG. 3, the ultra-thin semiconductor package 300 includes a sidewall protection layer 126 on a sidewall of the through hole 115 of the circuit board 110. The sidewall protection layer 126 improves the adhesive strength between the circuit board 110 and the EMC 160. The sidewall of the through hole 115 may become uneven when forming the through hole 115 in the circuit board 110. If the sidewall of the through hole 115 is uneven, the circuit board 110 and the EMC 160 may be lifted. Therefore, the sidewall protection layer 126 having a smooth surface is formed in the sidewall of the through hole 115, and the adhesive strength between the circuit board 110 and the EMC 160 is improved. In addition, the sidewall protection layer 126 may be further connected to the protection layer 125 formed in the first surface 110a or the second surface 110b of the circuit board 110.

Referring to FIG. 4, instead of the EMC 160 that covers the entire first surface 110a of the circuit board 110, an EMC 161 may be formed to occupy part of the circuit board 110. In this case, the protection layer 125 may be partly removed to expose the upper ball lands 120b which are formed in the first surface 110a of the circuit board 110.

Figure 5:
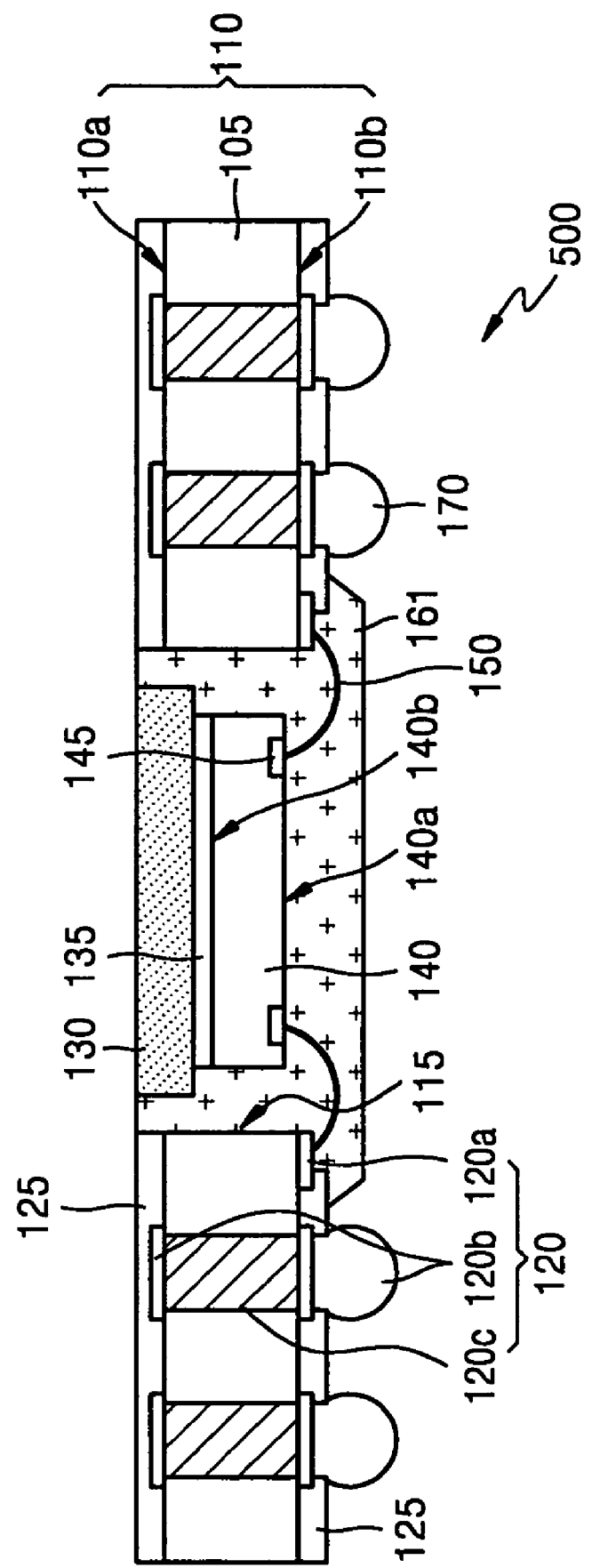
FIG. 5 is a cross-sectional view of an ultra-thin semiconductor package according to a fourth embodiment of the present invention.

Referring to FIG. 5, the supporter 130 may be disposed near the first surface 110a of the circuit board 110. In this case, the adhesive bonding layer 135 and the semiconductor chip 140 are sequentially attached to a lower surface of the supporter 130 and the bond finger 120a is located at the second surface 110b of the circuit board 110. The input/output pad 145 of the semiconductor chip 140 is electrically connected to the bond finger 120a by the connecting element 150.

Furthermore, a stacked semiconductor package may be formed by stacking several ultra thin semiconductor packages.

Referring to FIG. 6, the stacked semiconductor package 600 comprises a plurality of stacked unit packages 100a, 100b, 100c, and 100d. The unit packages 100a, 100b, 100c and 100d may have the same structures. In addition, the unit packages 100a, 100b, 100c, and 100d may include the semiconductor chip 140, the connecting element 150, and the EMC 161 partly covering the circuit board 110. That is, the semiconductor package, 400 and 500 of FIGS. 4 and 5 may be used.

The protection layer 125 expose the upper and lower ball lands 120b of the circuit board 110 of each of the unit packages 100a, 100b, 100c, and 100d such that the unit packages 100a, 100b, 100c, and 100d are electrically connected. Furthermore, the upper ball lands 120b formed on the first surface 110a and the lower ball lands 120b formed on the second surface 110b in the circuit board 110 of the unit packages 100a, 100b, 100c, and 100d may be aligned.

In addition, the unit packages 100a, 100b, 100c, and 100d are electrically connected by the solder balls 170, that is, the external connecting terminals. The solder balls 170, which are located between the upper and lower ball lands 120b, electrically connect the stacked unit packages 100a, 100b, 100c, and 100d. Here, it is preferable that a height H2 of the solder ball 170 is greater than a height H1 of the EMC 160, to allow for proper stacking and connection.

Therefore, by attaching the supporter 130, which has a thermal expansion coefficient similar to or larger than that of the EMC 160, to a lower surface of the semiconductor chip 140, the warpage of the semiconductor chip 140 caused by curing the EMC 160 and due to the difference in thermal expansion coefficients of the semiconductor chip 140 and the EMC 160, is reduced.

FIGS. 7A through 7F are cross-sectional views illustrating a method of manufacturing an ultra-thin semiconductor package according to a sixth embodiment of the present invention.

Referring to FIG. 7A, a resin board 105 is prepared. The resin board 105 has a first surface 110a and a second surface 110b on an opposite side of the resin board 105 as the first surface 110a. Then, a circuit pattern 120, which is electrically connected to each of the first and second surfaces 10a and 10b of the resin board 105, is formed. The forming of the circuit pattern 120 will now be explained.

A metal layer formed of Au, Ag, or Pd is plated on the second surface 110b of the resin board 105 and then a predetermined portion of the metal layer is etched to form lower ball lands 120b. In order to expose the lower ball lands 120b, a via hole (not shown) is formed by etching a predetermined portion of the resin board 105 and then a stud 120c is formed in the resin board 105 by filling a conductive layer inside the via hole. After plating the metal layer on the second surface 110b of the resin board 105, upper ball lands 120b and a bond finger 120a are formed by etching a predetermined portion of the metal layer in order for the metal layer and the stud 120c to contact. Here, the processes of forming the upper and lower ball lands are interchangeable. A circuit board 110 is completed by the formation of the bond finger 120a, the ball lands 120b and the stud 120c.

A through hole 115 is formed in a predetermined portion of the circuit board 110 according to the method explained above. It is preferable that the through hole 115 has a size larger than that of a semiconductor chip 140 that will be attached to the through hole later. Here, the order of forming the circuit pattern 120 and the through hole 115 can be reversed.

Thereafter, a protection layer 125, for instance, a resin or insulating layer, is formed on each of the first and second surfaces 10a and 110b of the circuit board 110. Then, a predetermined portion of the protection layer 125 may be removed in order to expose the bond finger 120a and the upper and lower ball lands 120b. If the EMC 160 is formed on the whole surface of the circuit board 110, as in the ultra-thin semiconductor package 200 illustrated in FIG. 2, it is preferable that only portions of the protection layer 125 formed on the bond finger 120a and formed on the lower ball lands 120b are removed. In addition, in the ultra-thin semiconductor package 200 as illustrated in FIG. 3, a sidewall protection layer 126 may be formed on a sidewall of the through hole 115. The sidewall protection layer 126 may be formed in the same process as the forming the protection layer 125.

Referring to FIG. 7B, a closure member 128 is attached to the second surface 10b of the circuit board 10 in order to cover the through hole 115. The closure member 128 may be slightly larger than the through hole 115 or be attached to the whole first surface 110a of the circuit board 110. The closure member 128 is formed of an insulating layer or an ultraviolet tape that can be exfoliated by ultraviolet rays. Then, a supporter 130 is attached to an upper surface of the closure member 128. It is preferable that the supporter 130 has a thermal expansion coefficient equal to or 1 to 10 times larger than that of an EMC which will be formed hereafter. In addition, the supporter 130 may have a square shape and be built in the through hole 115. A liquid material such as a resin material may be spread on the upper surface of the closure member 128 and is subsequently cured to form the supporter 130.

Referring to FIG. 7C, after placing an adhesive bonding layer 135 with a thickness of 10 to 30 µm on an upper surface of the supporter 130, a semiconductor chip 140 is attached to the upper surface of the supporter 130. The adhesive bonding layer 135 may be an adhesive sheet or paste. If the supporter 130 is formed of a resin material, the semiconductor chip 140 can be attached directly to the upper surface of the supporter 130 without interposing the adhesive bonding layer 135. The semiconductor chip 140 has a first surface 140a on which an input/output pad 145 is disposed and a second surface 140b is attached to the upper surface of the supporter 130 such that the first surface 140a is directed upwards.

Referring to FIG. 7D, the input/output pad 145 of the semiconductor chip 140 and the bond finger 120a, which is located at an edge of the through hole 115, are connected by a wire 150.

Referring to FIG. 7E, in order to protect the semiconductor chip 140 and the wire 150, a resin material is spread on a predetermined portion of the first surface 110a of the circuit board 110 and an EMC 161 is formed by carrying out a curing process with respect to the resin material at a predetermined temperature. As illustrated, the EMC 161 is formed to cover the semiconductor chip 140, the wire 150, and part of the circuit board 110. However, as in the ultra-thin semiconductor package 200 illustrated in FIG. 2, the EMC 161 may be formed on the entirety of the first surface 110a of the circuit board 110.

Referring to FIG. 7F, an external connecting terminal 170, for instance, a solder ball, is attached to the second surface 10b of the circuit board 110 such that the external connecting terminal 170 contacts the respective ball lands 120b. Then, the circuit board 110 is separated into respective unit packages by a singulation tool such as a saw, and thereafter the closure member 128 is removed from the lower surface of the supporter 130. The process of separating the closure member 128 may be performed prior to the separating of the circuit board 110. Thus, the ultra-thin semiconductor package is completed.

As described above, the ultra thin semiconductor package having a built-in semiconductor chip according to exemplary embodiments of the present invention includes a supporter with a thermal expansion coefficient substantially equal to or greater than that of an EMC and is attached to a lower portion of the EMC in order to improve warpage of the semiconductor chip resulting from a the difference in thermal expansion coefficients between the semiconductor chip and the EMC.

Thus, when curing the EMC, a contraction rate of the EMC is offset by that of the supporter, and, bending of the semiconductor chip and the EMC, that is the warpage, is prevented.

The height of the ultra-thin semiconductor package does not increase since warpage of the semiconductor package is prevented. Furthermore, the supporter is formed in the through hole of the circuit board, and thus, the height of the ultra-thin semiconductor package does not increase. In addition, cracks caused by warpage are also prevented.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An ultra thin semiconductor package comprising:
   a circuit board having a through hole;
   a semiconductor chip located in the through hole of the circuit board;
   a connecting element electrically connecting the circuit board and the semiconductor chip;
   an epoxy molding compound (EMC) covering the semiconductor chip and the connecting element;
   an external connecting terminal electrically connected to at least one side of the circuit board;
   a supporter attached to a lower surface of the semiconductor chip, at least a portion of the supporter being dispose within the through hole, and having a thermal expansion coefficient substantially equal to or greater than a thermal expansion coefficient of the EMC.

2. The semiconductor package of claim 1, wherein the circuit board comprises:
   a resin board having a first surface and a second surface on an opposite side of the resin board;
   a bond finger disposed in the first or second surface at an edge of the resin board near the through hole;
   a plurality of upper ball lands disposed in the first surface of the resin board;
   a plurality of lower ball lands disposed in the second surface of the resin board, each of the lower ball lands corresponding to one of the upper ball lands;
   a stud located in the resin board and electrically connecting the corresponding upper ball lands and the lower ball lands; and
   a protection layer covering the first and second surfaces of the resin board.

3. The semiconductor package of claim 2, wherein at least one of the upper and lower ball lands are electrically connected to the external connecting terminal.

4. The semiconductor package of claim 1, wherein the thermal expansion coefficient of the supporter is equal to or 1 to 10 times greater than the thermal expansion coefficient of the EMC.

5. The semiconductor package of claim 1, wherein the through hole is wider than the semiconductor chip.

6. The semiconductor package of claim 1, wherein the semiconductor chip includes:
   a first surface having input/output pads disposed near edges of both sides of the semiconductor chip; and
   a second surface attached to the supporter.

7. The semiconductor package of claim 1, wherein the connecting element is a wire.

8. The semiconductor package of claim 7, wherein the connecting element is a lead extended from the circuit board.

9. The semiconductor package of claim 1, wherein the EMC covers the semiconductor chip, the connecting element, and the circuit board.

10. The semiconductor package of claim 1, wherein the EMC covers a portion of the semiconductor chip, the connecting element, and a portion of the circuit board.

11. The semiconductor package of claim 1, wherein the EMC is a resin.

12. The semiconductor package of claim 1, wherein the supporter is formed of a resin material.

13. The semiconductor package of claim 1, wherein the supporter is formed of a metal layer.

14. The semiconductor package of claim 13, wherein the supporter is formed of copper.

15. The semiconductor package of claim 1, wherein the supporter has a thickness of about 10 to 50 µm.

16. The semiconductor package of claim 1, wherein the supporter and semiconductor chip are attached by an adhesive bonding layer.

17. The semiconductor package of claim 16, wherein the adhesive bonding layer is an adhesive sheet or paste.

18. The semiconductor package of claim 17, wherein the adhesive bonding layer has a thickness of about 10 to 50 µm.

19. The semiconductor package of claim 1, further comprising a sidewall protection layer formed at a sidewall of the through hole to enhance an adhesive strength between the sidewall of the through hole and the EMC.

20. The semiconductor package of claim 1, wherein the entire supporter is disposed within the through hole.

21. The semiconductor package of claim 1, wherein a width of the supporter is less than a width of the through hole.

22. The semiconductor package of claim 21, wherein a combined height of the supporter and the semiconductor chip is less than a height of the through hole.

23. A semiconductor package comprising:
   a circuit board having a first surface in which a bond finger and upper ball lands are disposed, a second surface in which lower ball lands electrically connected to the upper ball lands are disposed, and a through hole formed in the circuit board to a predetermined size;
   a supporter which is disposed in the through hole of the circuit board;
   a semiconductor chip attached to an upper surface of the supporter and having an input/output pad on an upper edge of the semiconductor chip;
   a connecting element electrically connecting the semiconductor chip and the bond finger, the bond finger being located near an edge of the through hole;
   an epoxy molding compound (EMC) covering the semiconductor chip, the connecting element, and at least part of the circuit board; and
   a solder ball electrically connected to at least one of the upper or lower ball lands of the circuit board,
   wherein a thermal expansion coefficient of the supporter is equal to or 1 to 10 times greater than a thermal expansion coefficient of the EMC.

24. The semiconductor package of claim 23 further comprising:
   a first protection layer covering the first surface of the circuit board; and
   a second protection layer covering the second surface of the circuit board, wherein the first and second protection layers have holes that expose at least one of the bond finger and the upper and lower ball lands.

25. The semiconductor package of claim 23, further comprising a sidewall protection layer formed on a sidewall of the through hole.

26. A semiconductor package stack comprising:
   at least two ultra-thin semiconductor packages that are stacked; and
   a solder ball electrically connecting semiconductor packages,
   wherein each ultra-thin semiconductor package includes:
   a circuit board including:
   a first surface in which upper ball lands are disposed;
   a second surface in which lower ball lands are disposed, the lower ball lands electrically connected to the upper ball lands;
   a through hole formed therethrough to a predetermined size; and
   a bond finger disposed in the first surface of the circuit board located near an edge of the through hole;
   a supporter disposed in the through hole of the circuit board having an upper surface;
   a semiconductor chip having a lower surface and upper surface, wherein the lower surface of the chip is attached to the upper surface of the supporter and including an input/output pad at an edge of the upper surface of the chip;
   a connecting element electrically connecting the input/output pad of the semiconductor chip and the circuit board bond finger;
   an epoxy molding compound (EMC) covering the semiconductor chip, the connecting element and at least part of the circuit board; and
   a solder ball electrically connected to at least one of the upper or lower ball lands of the circuit board,
   wherein a thermal expansion coefficient of the supporter is equal to or 1 to 10 times greater than a thermal expansion coefficient of the EMC,
   and wherein the solder balls electrically connect the lower ball lands of an ultra-thin semiconductor package to the upper ball lands of another ultra-thin semiconductor package.

27. The semiconductor package of claim 26, wherein each of the circuit boards further comprises:
   a first protection layer covering the first surface of the circuit board; and a second protection layer covering the second surface of the circuit board,
   wherein the first and second protection layers have holes that expose at least one of the bond finger and the upper and lower ball lands.

* * * * *

UNITED STATES PATENT AND TRADEMARK OFFICE
CERTIFICATE OF CORRECTION

PATENT NO.          : 7,105,919 B2
APPLICATION NO. : 10/982361
DATED                 : September 12, 2006
INVENTOR(S)        : Hyeong-Seob Kim Page 1 of 1

It is certified that error appears in the above-identified patent and that said Letters Patent is hereby corrected as shown below:

Column 5, lines 29-30, the words "10a and 10b" should read -- 110a and 110b --;
Column 5, line 57, the word "10a" should read -- 110a --;
Column 6, line 5, the word "10b" should read -- 110b --;
Column 6, line 5, the word "10" should read -- 110 --;
Column 6, line 50, the word "10b" should read -- 110b --.

Signed and Sealed this

Eleventh Day of August, 2009

David J. Kappos
*Director of the United States Patent and Trademark Office*